United States Patent
Reichel et al.

(10) Patent No.: US 8,497,696 B2
(45) Date of Patent: Jul. 30, 2013

(54) TEST SIGNAL DETECTION SYSTEM HAVING A PROBE WITH HIGH-PRECISION DC-VOLTAGE MEASUREMENT

(75) Inventors: Thomas Reichel, Baldham (DE); Martin Peschke, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 416 days.

(21) Appl. No.: 12/745,729

(22) PCT Filed: Oct. 27, 2008

(86) PCT No.: PCT/EP2008/009067
§ 371 (c)(1),
(2), (4) Date: Jun. 2, 2010

(87) PCT Pub. No.: WO2009/071156
PCT Pub. Date: Jun. 11, 2009

(65) Prior Publication Data
US 2010/0277190 A1    Nov. 4, 2010

(30) Foreign Application Priority Data

Dec. 4, 2007    (DE) .......................... 10 2007 058 338
Feb. 20, 2008    (DE) .......................... 10 2008 009 962

(51) Int. Cl.
*G01R 31/20*    (2006.01)
*G01R 19/00*    (2006.01)
(52) U.S. Cl.
USPC ................ 324/754.01; 324/76.11; 324/121 R
(58) Field of Classification Search
None
See application file for complete search history.

(56) References Cited

U.S. PATENT DOCUMENTS

| | | | |
|---|---|---|---|
| 4,403,183 A | 9/1983 | Lueker | |
| 4,743,839 A * | 5/1988 | Rush | 324/72.5 |
| 4,833,400 A * | 5/1989 | Boutigny | 324/126 |
| 5,034,698 A | 7/1991 | Moriyasu | |
| 5,384,532 A | 1/1995 | Uhling | |
| 5,446,371 A * | 8/1995 | Eccleston et al. | 324/121 R |
| 6,856,126 B2 | 2/2005 | McTigue et al. | |
| 7,740,501 B2 * | 6/2010 | Ballard et al. | 439/578 |
| 2003/0025485 A1 * | 2/2003 | McTigue | 324/72.5 |
| 2006/0061348 A1 | 3/2006 | Cannon et al. | |

FOREIGN PATENT DOCUMENTS

EP    0 786 647 A1    7/1997

OTHER PUBLICATIONS

International Preliminary Report on Patentability, PCT/EP2008/009067, Oct. 7, 2010, pp. 1-11.
International Search Report, PCT/EP2008/009067, Feb. 20, 2009, pp. 27-30.
T.F. Uhling et al., "Aktiv bis uber 2,5 GHz", Messen+ Testen, Hochstfrequenz-Tastkopf, Elektronic, Apr. 1994, pp. 70-72 (English Abstract Included).

* cited by examiner

*Primary Examiner* — Vinh Nguyen
(74) *Attorney, Agent, or Firm* — Ditthavong Mori & Steiner, P.C.

(57) ABSTRACT

A test-signal detection system provides a probe, a first transmission line and a measuring device. The probe is connected to the measuring device by the first transmission line. The first transmission line transmits broadband test signals to the measuring device. The test-signal detection system provides at least one further transmission line. The probe is additionally connected to the measuring device at least indirectly by the at least one further transmission line. The at least one further transmission line transmits DC-voltage test signals to the measuring device.

19 Claims, 2 Drawing Sheets

TEST SIGNAL DETECTION SYSTEM HAVING A PROBE WITH HIGH-PRECISION DC-VOLTAGE MEASUREMENT

CROSS-REFERENCE TO RELATED APPLICATION

The present application is a national phase application of PCT Application No. PCT/EP2008/009067, filed on Oct. 27, 2008, and claims priority to German Application No. DE 10 2007 058 338.0, filed on Dec. 4, 2007, and German Application No. DE 10 2008 009 962.7, filed on Feb. 20, 2008, the entire contents of which are herein incorporated by reference.

BACKGROUND OF THE INVENTION

1. Field of the Invention

The invention relates to a probe for connection to measuring devices, especially to oscilloscopes, with high-precision, DC-voltage measurement.

2. Discussion of the Background

In order to keep pace with the ever-increasing bandwidths of modern bus systems, modern active probes also have to provide ever-increasing bandwidths. The amplifiers required for this purpose must be continuously optimized in the direction towards larger bandwidths (for example, 5 GHz and above). Statistical properties, such as DC-voltage amplification and offset, must be sacrificed to the demand for larger bandwidth. However, alongside the measurement of fast signals, a very precise measurement of DC-voltages is often also desirable in practice. To measure DC-voltages as accurately as possible, the current practice is initially to match the probe to an earth potential and to eliminate the DC-voltage offset via the position adjustment on the basic device. After this, the DC-voltage to be measured can be determined in an offset-free manner. This method is costly, does not eliminate the amplification error and cannot be used in the case of an AC voltage coupling. A parallel, high-precision DC-voltage measurement, which can be displayed independently of the test signal, would be desirable.

With currently available broadband probes for oscilloscopes, DC-voltages can only be measured very inaccurately, typically with an amplification error of 2% and an offset of several millivolts. Added to this is the error from the input resistance of the oscilloscope (typically 1%), the amplification error of the input amplifier and of the analog/digital converter in the oscilloscope (typically 1%) and the associated offsets. These errors can in fact be calibrated; however, the DC-voltage accuracy is unsatisfactory, because the calibration depends, for example, upon channel, temperature and selected amplification and position. Moreover, non-linearities cannot be calibrated at all.

Accordingly, U.S. Pat. No. 6,856,126 B2 discloses a conventional probe for broadband measurement of high-frequency test signals. The entire signal is picked up with a probe tip. The entire signal is amplified by the same amplifier and transmitted to the measuring device by the same line. The problems described of inaccurate DC-voltage measurement are very clearly evident. A compensation of non-linear interference of the DC-voltage components is not possible.

SUMMARY OF THE INVENTION

Embodiments of the invention advantageously provide a device, which allows a high-precision, simultaneous measurement of DC-voltage components of a signal alongside the measurement of broadband frequency components and is associated with only low manufacturing and operating costs.

A test-signal detection system provides a probe, a first transmission line and a measuring device. The probe is connected by means of the first transmission line to the measuring device. The first transmission line transmits broadband test signals to the measuring device. The test-signal detection system provides at least one further transmission line. The probe is additionally connected to the measuring device at least indirectly by means of the at least one further transmission line. The at least one further transmission line transmits DC-voltage test signals to the measuring device. Accordingly, DC-voltage test signals are transmitted to the measuring device separately from the broadband test signals and measured. In this manner, a reduction of interference and measurement inaccuracies in DC-voltage test signals is possible.

The at least one transmission line and the at least one further transmission line are preferably guided in a common, hybrid cable. As a result, the complexity of cabling for the operating personnel is reduced.

The probe is preferably an active probe. Accordingly, particularly weak signals can be measured. A favorable high-frequency performance is additionally achieved.

A connection housing with an interface is advantageously provided. The probe is preferably mechanically connected to the first transmission line and to the at least one further transmission line. The first transmission line and the at least one further transmission line are preferably mechanically connected to the connection housing. The transmission lines are preferably connected to the measuring device by means of the interface of the connection housing. Accordingly, all components of the test-signal detection system are securely enclosed and therefore protected from mechanical damage. This also achieves a simple screening.

The probe preferably contains a broadband amplifier and a DC-voltage amplifier. Through the amplification of the signals in the probe, coupled interference during the transmission is avoided.

Amplification factors of the broadband amplifier and of the DC-voltage amplifier are advantageously independently adjustable. Accordingly, signals with signal components of different strengths can be measured in an optimal manner.

The probe preferably contains at least one probe tip, which preferably records at least one broadband component and at least one DC-voltage component of at least one signal. Accordingly, the structure of the probe can be realized in a favourable manner. An additional awkwardness associated with the repeated application of the probe tips for the different signal components is avoided in this manner.

The probe preferably contains at least one divider network, which advantageously comprises at least one serial ohmic resistor and at least one parallel ohmic resistor with reference to earth. By preference, the at least one probe tip is connected to the at least one divider network. The at least one divider network is advantageously connected to the broadband amplifier. Through the use of a divider network, on the one hand, strong signals can be measured in an efficient manner. Moreover, an impedance matching of the probe is possible in this manner.

The divider network preferably additionally contains a capacitor, which is connected in parallel to the serial ohmic resistor. The divider network preferably additionally contains a capacitor with reference to earth, which is connected in parallel to the parallel ohmic resistor. Broadband frequency components of the test signal preferably pass via the capacitors. DC-voltage components of the test signal preferably pass via the ohmic resistors. In this manner, a separation of the broadband frequency component from the DC-voltage component is possible.

The DC-voltage amplifier is preferably connected directly or via an ohmic resistor to the at least one probe tip or to the at least one parallel ohmic resistor or directly or via an ohmic resistor to the end of the divider network facing towards the broadband amplifier. Different connection variants are accordingly possible. This increases the flexibility of production technology and allows transmission properties to be adapted to the individual purpose of the application.

The DC-voltage amplifier advantageously contains an operational amplifier, an ohmic resistor and a capacitor. The ohmic resistor and the capacitor are advantageously connected between an inverting input and an output of the operational amplifier. The DC-voltage amplifier is advantageously an inverting amplifier and preferably provides a low-pass characteristic. Accordingly, the separation of the broadband frequency component and the DC-voltage component of the test signal is achieved.

The connection housing preferably contains at least one analog/digital converter, which is advantageously connected to the at least one further transmission line. The connection housing preferably contains a microprocessor, which is advantageously connected to the at least one analog/digital converter. By preference, the microprocessor reroutes a digital output signal of the at least one analog/digital converter to the measuring device. In this manner, the DC-voltage signal is already measured by the probe. A matching of the measuring device to different DC-voltage test signals is not necessary.

The microprocessor preferably reroutes the digital output signal of the at least one analog/digital converter via a digital data bus to the measuring device. In this manner, the measuring device can transfer the measured results of the DC-voltage signal via a standardized interface.

The microprocessor preferably averages the DC-voltage signal over a given time interval. This achieves an increase in the accuracy of the measurement. Short-term fluctuations are compensated.

The microprocessor preferably implements a test-value correction of the DC-voltage signal. The quality of the measured results is further increased as a result. Measurement errors are filtered out before reaching the measuring device.

The value of the DC-voltage signal digitized by the at least one analog/digital converter preferably adjusts an amplification factor and/or an offset of the broadband amplifier in the probe. Accordingly, an optimal adjustment of the amplification factor and/or of the offset is achieved on the basis of a very accurate measured result of the DC-voltage signal.

The measuring device advantageously provides at least one input amplifier and at least one analog/digital converter. The at least one transmission line is advantageously connected to the at least one input amplifier, which is preferably connected to the at least one analog/digital converter. Broadband test signals are advantageously amplified by the at least one input amplifier and preferably digitized by the at least one analog/digital converter. The at least one analog/digital converter connected to the at least one further transmission line preferably provides a substantially lower level of the quantisation steps than the at least one analog/digital converter disposed in the measuring device. Moreover, the at least one analog/digital converter connected to the at least one further transmission line preferably provides a substantially longer processing time per test value than the at least one analog/digital converter disposed in the measuring device. In this manner, the DC-voltage signal can be measured with substantially greater accuracy relative to the broadband signal. Through the use of relatively slower components, this gain in quality can be achieved without increased structural complexity.

In a further embodiment, the test-signal detection system preferably comprises two further transmission lines and preferably two probe tips. The connection housing preferably provides two analog/digital converters. A differential signal can advantageously be picked up with the probe and transmitted to the measuring device. The measurement of differential signals separated according to broadband component and DC-voltage component is possible in this manner.

BRIEF DESCRIPTION OF THE DRAWINGS

In the following section, the invention is described by way of example with reference to the drawings, in which advantageous exemplary embodiments of the invention are presented. The drawings are as follows.

DETAILED DESCRIPTION OF EXEMPLARY EMBODIMENTS OF THE INVENTION

Initially, the structure and functioning of a conventional probe is explained with reference to FIG. 1. The structure and functioning of various exemplary embodiments of the probe according to the invention are illustrated by means of FIGS. 2-4. In some cases, the presentation and description of identical elements in similar drawings has not been repeated.

Figure 1:
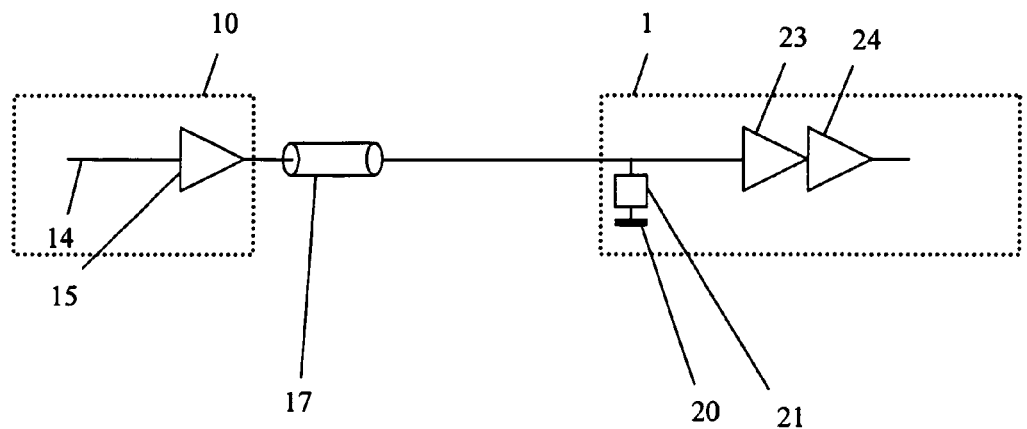
FIG. 1 shows a block-circuit diagram of a first exemplary probe.

FIG. 1 shows a block-circuit diagram of a first non-inventive probe. A probe 10 comprises a probe tip 14 and a broadband amplifier 15. The latter amplifies signals within a very broad frequency band. The probe 10 is connected to a measuring device 1 by means of a transmission line 17. The transmission line 17 is designed as a coaxial line. The measuring device 1 is, for example, an oscilloscope. A use of a spectrum analyser or another measuring device is equally possible. The measuring device 1 provides an input amplifier 23 and an analog/digital converter 24. Furthermore, the transmission line 17 is terminated within the measuring device by means of a parallel, ohmic resistor 21, for example, of 50 ohms, connected to earth 20.

A signal from the probe tip 14 is picked up in a high-ohmic manner and buffered by the broadband amplifier 15. The buffered signal is transmitted from the transmission line 17 to the measuring device 1. Within the measuring device 1, the signal from the input amplifier 23 is amplified before it is converted by the analog/digital converter 24 into a digital signal. The digital signal can now be further processed and displayed. The DC-voltage measurement-errors of the broadband amplifier 15, of the input amplifier 23 and of the analog/digital converter 24, for example, offset errors, are very large, because broadband components are involved. Accordingly, the DC-voltage test value of the display is influenced by a larger error.

Figure 2:
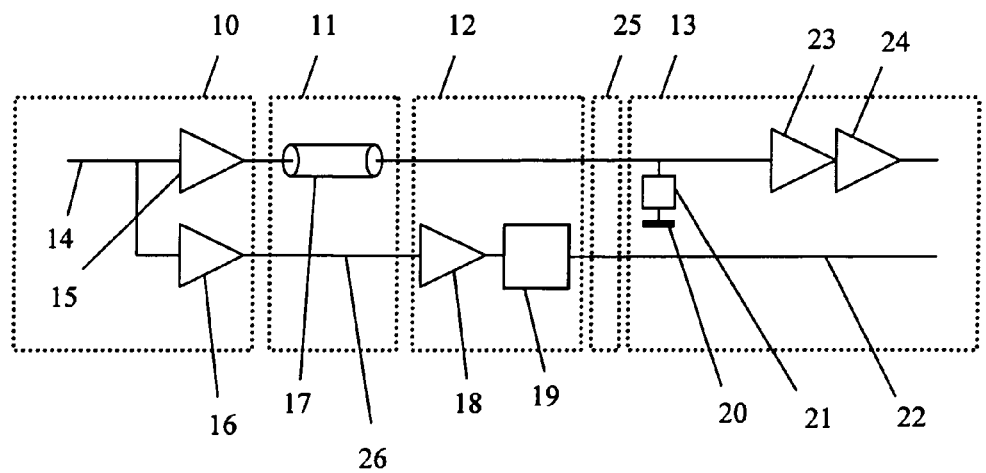
FIG. 2 shows a block-circuit diagram of a first exemplary embodiment of the probe according to the invention.

FIG. 2 shows a block-circuit diagram of a first exemplary embodiment of the probe according to the invention. A probe 10 contains a probe tip 14, a broadband amplifier 15 and a DC-voltage amplifier 16. The probe 10 is connected to a hybrid cable 11. The hybrid cable 11 contains a transmission line 17 for the transmission of broadband test signals and a transmission line 26 for the transmission of DC-voltage test signals. In this context, broadband test signals are test signals, which can provide signal components in a very broad frequency band. The hybrid cable 11 is connected to a measuring device 13 by means of a connection housing 12. The connection housing 12 contains an analog/digital converter 18 and a microprocessor 19. The microprocessor 19 is connected via an interface 25 to a digital bus 22 within the measuring device 13. This digital bus can be, for example, a universal serial bus (USB). The transmission line 17 is connected via the connection housing 12 to an input amplifier 23 and an analog digital converter 24 within the measuring device 13. As an alternative, the analog/digital converter 18 and the microprocessor 19 can be omitted. The transmission line 26 is then connected directly via the interface to the measuring device 13. The DC-voltage signals amplified by the DC-voltage amplifier 16 are then rerouted without further processing to the measuring device 13. An internal amplifier and an internal analog/digital converter are used for the further processing of the signal.

A signal is picked up in a high-ohmic manner from the probe tip 14 and separated into a broadband component and a DC-voltage component. The broadband component in this context contains signal components, which can contain a very broad signal spectrum. The broadband component is buffered by the broadband amplifier 15 and transmitted via the transmission line 17 in the hybrid cable 11, via the connection housing 12 to the measuring device 13. The DC-voltage component of the signal is amplified by the DC-voltage amplifier 16 and transmitted via the transmission line 26 in the hybrid cable 11 to the connection housing 12. There, it is converted by the analog/digital converter 18 into a digital signal. Since the output voltage of the DC-voltage amplifier 16 is picked up in a high-ohmic manner, the tolerance of the input and output resistors of the transmission line 17 in the broadband path is cancelled. In this context, the broadband path denotes the signal path designed for the measurement of broadband signals. Furthermore, slow and high-precision elements can be used as buffers and converters, thereby avoiding offsets and amplification errors of the broadband amplifier 23 and analog/digital converter 24.

The microprocessor 19 implements an averaging and/or a test-value correction on the signal. Via the interface 25 and the digital bus 22, the microprocessor 19 communicates the digitally re-processed signal to the measuring device 13. In the case of the test-value correction, non-linear relationships of input and output voltage and temperature dependencies of the precise DC-voltage path can be taken into consideration, which is not possible in this manner in the basic device with a correction of the broadband measured data occurring. The broadband amplifier 23 in the measuring device 13 amplifies the broadband signal once again before it is converted by the analog/digital converter 24 into a digital signal. The two digital signals can now be further processed and displayed.

Figure 3:
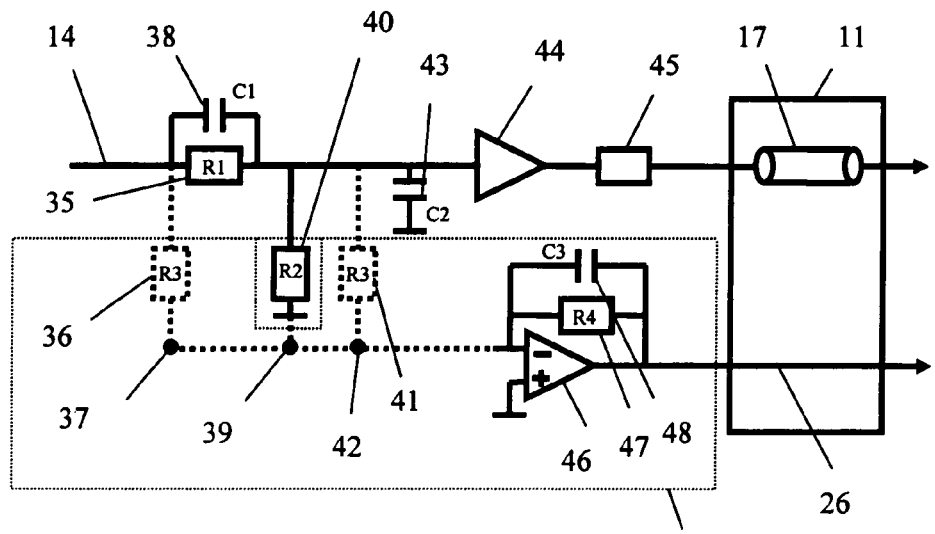
FIG. 3 shows a circuit diagram of a second exemplary embodiment of the probe according to the invention.

FIG. 3 shows a circuit diagram of a second exemplary embodiment of the probe according to the invention. The probe tip 14 is connected to a compensated RC divider comprising resistors 35, 40 (R1, R2) and capacitors 38, 43 (C1, C2). The DC-voltage amplifier 50 is designed as an operational amplifier 46 in inverting configuration. The resistors 36 (R3) or 40 (R2) or 41 (R3) and 47 (R4) and the capacitor 48 (C3) form this inverting configuration. If the connection of the DC-voltage amplifier 50 is implemented via the resistor 40 (R2), the latter is a part of the voltage divider of the broadband amplifier and also a part of the DC-voltage amplifier 50. If the DC-voltage amplifier 50 is connected via one of the resistors 36 (R3) or 41 (R3), the resistor 40 (R2) is not a part of the DC-voltage amplifier 50. The advantage of an inverting circuit is that the voltage can be measured directly with reference to earth. A low-pass characteristic of the DC-voltage amplifier 50 is additionally realized by the feedback capacitor 48 (C3). The virtual earth, which arises at the negative input of the operational amplifier 46, together with the feedback capacitor 48 (C3), ensures that the typically large input capacitance of the high-precision operational amplifier does not falsify the frequency response.

Moreover, this circuit simplifies the design of the operational amplifier as a chopper amplifier or auto-zero amplifier, because electronic switches at the amplifier input need not provide a high input-voltage range. With very high frequencies, the current only flows via the capacitive divider 38, 43 (C1, C2). The broadband amplifier 44 is illustrated merely in a schematic manner and has an output resistance 45 of 50 ohms. The pickup for the DC-voltage amplifier, here, the operational amplifier 46, configured in an inverting manner, can be implemented at the connection 37, upstream of the divider. In this case, the operational amplifier is connected via the resistor 36 (R3). As an alternative, the connection can be made at the connection 39 at the base-point of the divider. In this case, the earth connection there is omitted. Furthermore, the connection to the connection 42 can be made at the mid-point of the divider. In this case, the connection is made via the resistor 41 (R3).

The values of the components are typically approximately C1=0.5 pF and C2=2 pF. In the case of a connection of the operational amplifier upstream of the divider, the following approximate values apply: R1=1600 kOhm, R2=400 kOhm, R3=2000 kOhm, R4=200 kOhm. In the case of a connection at the base-point of the divider, the following approximate values apply: R1=800 kOhm, R2=200 kOhm, R4=100 kOhm. In the case of a connection at the mid-point of the divider, the following approximate values apply: R1=800 kOhm, R3=250 kOhm, R3=1000 kOhm, R4=500 kOhm for a 10:1 division in both paths. The resistor 45 is the output resistor (preferably 50 ohms) of the transmission line 17. The 10:1 division in the broadband path comes about through a division factor of 1:5 for the broadband path up to the broadband amplifier 44 and a further division factor of 1:2, which originates from the output resistance 45 and a terminal resistance of 50 ohms, not illustrated. The DC-voltage signal is transmitted via a line 26 disposed in the hybrid cable.

Figure 4:
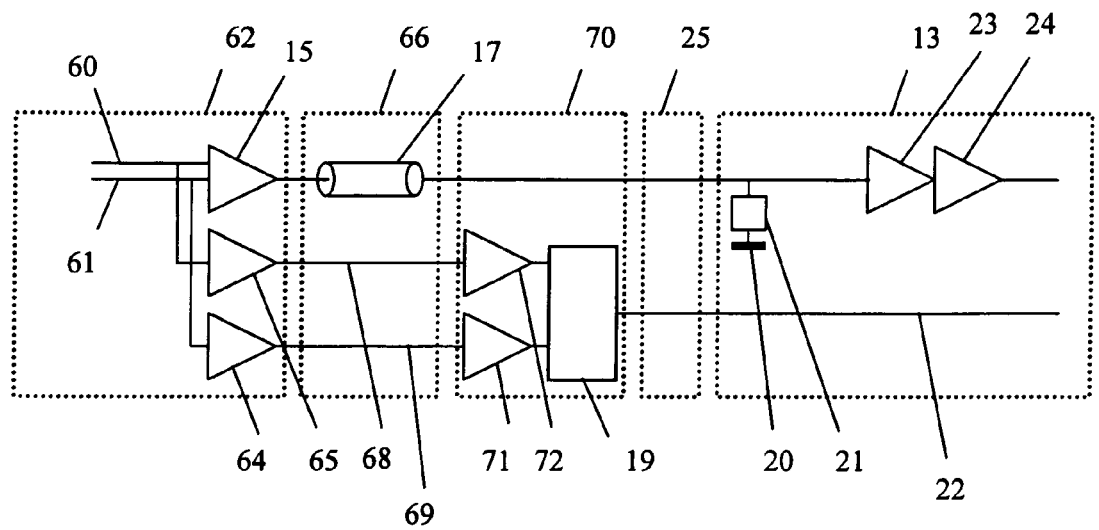
FIG. 4 shows a block circuit diagram of a third exemplary embodiment of the probe according to the invention.

FIG. 4 shows a block circuit diagram of a third exemplary embodiment of the probe according to the invention. A probe 62 contains two probe tips 60, 61, a broadband amplifier 15 and two DC-voltage amplifiers 64, 65. The probe 62 is connected to a hybrid cable 66. The hybrid cable 66 contains a transmission line 17 for the transmission of broadband test signals and two transmission lines 68, 69 for the transmission of DC-voltage test signals. The hybrid cable 66 is connected by means of a connection housing 70 to a measuring device 13. The connection housing 70 contains two analog/digital converters 71, 72 and a microprocessor 19. The microprocessor 19 is connected to a digital bus 22 within the measuring device 13. The transmission line 17 is connected via the connection housing 70 to a broadband amplifier 23 and an analog/digital converter 24 within the measuring device 13.

A differential signal is picked up in a high-ohmic manner by the probe tips 60, 61 and separated into a broadband component and a DC-voltage component. The broadband component is buffered by the broadband amplifier 15 and transmitted via the transmission line 17 in the hybrid cable 66 via the connection housing 70 to the measuring device 13. The DC-voltage component of the signal is amplified by the DC-voltage amplifiers 64, 65 and transmitted via the transmission lines 68, 69 in the hybrid cable 66 to the connection housing 70. There, it is converted by the analog/digital converters 71, 72 into digital signals. Since the output voltage of the DC-voltage amplifiers 64, 65 is picked up in a high-ohmic manner, the tolerance of the input and output resistors of the transmission line 17 is omitted in the broadband path. Furthermore, slow and high-precision elements can be used as buffers and converters, thereby avoiding offsets and amplification errors of the broadband amplifier 23 and analog/digital converter 24.

The microprocessor 19 implements an averaging and/or a test-value correction on the signals. Via the digital bus 22, the microprocessor 19 communicates the digital, re-processed signals to the measuring device 13. In the test-value correction, non-linear relationships of input and output voltage and temperature dependencies of the DC-voltage paths can also be taken into consideration, which is not possible in this manner with a correction of the broadband measured data occurring in the measuring device 13. The broadband amplifier 23 in the measuring device 13 amplifies the broadband signal once again before it is converted by the analog/digital converter 24 into a digital signal. The three digital signals can now be further processed and displayed. As an alternative to the two amplifiers 64, 65 and lines 68, 69, a single differential amplifier with a single differential line can also be used.

The invention is not restricted to the exemplary embodiment illustrated. As already mentioned, other, different types of signal can be recorded via an arbitrary number of probe tips and transmitted via an arbitrary number of lines. The use of different amplifiers, for example, with a non-inverting structure is also possible. All of the features described above or illustrated in the drawings can be combined with one another as required within the framework of the invention.

The invention claimed is:

1. A test-signal detection system, comprising:
   at least one first transmission line and a measuring device,
   a probe connected to the measuring device by the first transmission line,
   the first transmission line transmitting broadband test signals to the measuring device,
   at least one further transmission line,
   wherein the probe is additionally connected to the measuring device at least indirectly by the at least one further transmission line,
   the at least one further transmission line transmitting a digital representation of DC-voltage test signals to the measuring device, and
   a connection housing comprising an interface coupled to the measuring device coupled and at least one analog/digital converter,
   wherein the probe is mechanically connected to the first transmission line and to the at least one further transmission line,
   the first transmission line and the at least one further transmission line are mechanically connected to the connection housing,
   the transmission lines are connected by the interface of the connection housing to the measuring device, and
   the at least one further transmission line is connected to the at least one analog/digital converter,
   wherein the first transmission line and the at least one further transmission line are guided within a common, hybrid cable.

2. The test-signal detection system according to claim 1, wherein
   the probe is an active probe.

3. The test-signal detection system according to claim 1, wherein
   the probe contains a broadband amplifier and a DC-voltage amplifier.

4. The test-signal detection system according to claim 3, wherein
   amplification factors of the broadband amplifier and of the DC-voltage amplifier are independently adjustable.

5. The test-signal detection system according to claim 3, wherein
   the probe contains at least one probe tip, and
   the probe tip records at least one broadband component and at least one DC-voltage component of the test signal.

6. The test-signal detection system according to claim 5, wherein
   the probe contains at least one divider network,
   the at least one divider network comprises at least one serial ohmic resistor and at least one parallel ohmic resistor with reference to earth, and
   the at least one probe tip is connected to the at least one divider network, and that the at least one divider network is connected to the broadband amplifier.

7. The test-signal detection system according to claim 6, wherein
   the divider network additionally contains a capacitor, which is connected in parallel to the serial ohmic resistor,
   the divider network additionally contains a capacitor with reference to earth, which is connected in parallel to the parallel ohmic resistor,
   broadband frequency components of the test signal pass via the capacitors, and
   DC-voltage components of the test signal pass via the ohmic resistors.

8. The test-signal detection system according to claim 6, wherein
   the DC-voltage amplifier is connected directly or via an ohmic resistor to the probe tip.

9. The test-signal detection system according to claim 6, wherein
   the DC-voltage amplifier is connected to the at least one parallel ohmic resistor.

10. The test-signal detection system according to claim 6, wherein
   the DC-voltage amplifier is connected directly or via an ohmic resistor to the end of the divider network facing towards the broadband amplifier.

11. The test-signal detection system according to claim 5 wherein
   the measuring device provides at least one input amplifier and at least one analog/digital converter,
   the first transmission line is connected to the at least one input amplifier,
   the input amplifier is connected to the analog/digital converter,
   broadband test signals are amplified by the input amplifier,
   amplified, broadband test signals are digitized by the analog/digital converter,
   the analog/digital converter connected to the further transmission line provides a substantially lower level of the quantization stages than the analog/digital converter disposed in the measuring device for the broadband test signal, and
   the analog/digital converter connected to the further transmission line provides a substantially longer processing time per test value than the analog/digital converter for the broadband test signal.

12. The test-signal detection system according to claim 11, wherein
the test-signal detection system provides two further transmission lines,
the probe provides two probe tips,
the connection housing provides two analog/digital converters for the DC-voltage test signal, and
a differential signal can be picked up by the probe and transmitted to the measuring device.

13. The test-signal detection system according to claim 5 wherein
the test-signal detection system provides two further transmission lines,
the probe provides two probe tips,
the connection housing provides two analog/digital converters for the DC-voltage test signal, and
a differential signal can be picked up by the probe and transmitted to the measuring device.

14. The test-signal detection system according to claim 3 wherein
the DC-voltage amplifier contains an operational amplifier, an ohmic resistor and a capacitor,
the ohmic resistor and the capacitor are connected between an inverting input and an output of the operational amplifier,
the DC-voltage amplifier is an inverting amplifier, and
the DC-voltage amplifier provides a low-pass characteristic.

15. The test-signal detection system according to claim 1 wherein
the connection housing contains a microprocessor,
the microprocessor is connected to the at least one analog/digital converter, and
the microprocessor reroutes a digital output signal of the at least one analog/digital converter to the measuring device via an interface.

16. The test-signal detection system according to claim 15, wherein
the microprocessor reroutes the digital output signal of the at least one analog/digital converter via a digital data bus to the measuring device.

17. The test-signal detection system according to claim 15 wherein
the microprocessor averages the DC-voltage signal over a given time interval.

18. The test-signal detection system according to claim 15 wherein
the microprocessor implements a test-value correction of the DC-voltage signal.

19. The test-signal detection system according to claim 15 wherein
the value of the DC-voltage signal digitized by the at least one analog/digital converter adjusts an amplification factor and/or an offset of the broadband amplifier in the probe.

* * * * *